(12) United States Patent
Kukanskis et al.

(10) Patent No.: US 6,585,904 B2
(45) Date of Patent: *Jul. 1, 2003

(54) METHOD FOR THE MANUFACTURE OF PRINTED CIRCUIT BOARDS WITH PLATED RESISTORS

(76) Inventors: Peter Kukanskis, 245 Quassapaug Rd., Woodbury, CT (US) 06798; Dennis Fritz, 11047 James Rd., Brookville, IN (US) 47012; Frank Durso, 386 Towpath La., Cheshire, CT (US) 06410; Steven Castaldi, 330 Notinghill Gate, Torrington, CT (US) 06790; David Sawoska, 22 Kent Ter., Watertown, CT (US) 06795

( * ) Notice: Subject to any disclaimer, the term of this patent is extended or adjusted under 35 U.S.C. 154(b) by 155 days.

This patent is subject to a terminal disclaimer.

(21) Appl. No.: 09/784,242

(22) Filed: Feb. 15, 2001

(65) Prior Publication Data

US 2002/0135459 A1 Sep. 26, 2002

(51) Int. Cl.[7] .................... H01B 13/00; H01L 23/48
(52) U.S. Cl. .............. 216/13; 216/67; 216/65; 216/74; 216/75; 219/121.69; 438/382; 257/690; 174/250
(58) Field of Search .............. 216/13, 67, 65, 216/74, 75; 219/121.69; 438/382; 257/690; 174/250

(56) References Cited

U.S. PATENT DOCUMENTS

| 2,662,957 A | 12/1953 | Eisler ........................ 338/2 |
|---|---|---|
| 3,607,389 A | * 9/1971 | Canegallo et al. .......... 338/308 |
| 3,808,576 A | 4/1974 | Castonguay et al. ........ 252/518 |
| 3,982,045 A | 9/1976 | Kukanskis .................. 427/98 |
| 4,191,938 A | * 3/1980 | Gow et al. ............. 219/121.69 |
| 4,847,114 A | 7/1989 | Brasch et al. ................ 427/96 |
| 4,863,758 A | 9/1989 | Rhodenizer .................. 427/97 |
| 4,976,990 A | 12/1990 | Bach et al. .................. 427/98 |
| 4,978,422 A | 12/1990 | Letize et al. ................. 216/13 |
| 5,032,427 A | 7/1991 | Kukanskis et al. ........... 427/97 |
| 5,207,867 A | 5/1993 | Cordani ...................... 216/17 |
| 5,221,418 A | 6/1993 | Cordani ...................... 216/13 |
| 5,246,817 A | 9/1993 | Shipley, Jr. ................ 430/312 |
| 5,254,968 A | * 10/1993 | Zirnheld .................... 219/510 |
| 5,270,493 A | 12/1993 | Inoue et al. ................ 174/253 |
| 5,296,334 A | 3/1994 | Castaldi et al. ............. 430/280 |
| 5,332,487 A | 7/1994 | Young, Jr. et al. ........... 205/80 |
| 5,431,959 A | 7/1995 | Kologe et al. .............. 427/304 |
| 5,478,462 A | 12/1995 | Walsh ........................ 205/169 |
| 5,620,612 A | 4/1997 | Kukanskis et al. ........... 216/18 |
| 5,747,098 A | 5/1998 | Larson ........................ 427/58 |
| 5,935,706 A | 8/1999 | Hoover et al. .............. 428/375 |
| 5,945,257 A | 8/1999 | Doeling ..................... 430/313 |
| 6,047,463 A | * 4/2000 | Ulmer ......................... 29/620 |
| 6,281,090 B1 | * 8/2001 | Kukanskis et al. ......... 257/690 |

FOREIGN PATENT DOCUMENTS

WO   PCT/US88/02860   9/1989

* cited by examiner

Primary Examiner—Robert Kunemund
Assistant Examiner—Shamim Ahmed
(74) Attorney, Agent, or Firm—Carmody & Torrance LLP

(57) ABSTRACT

A process is revealed whereby resistors can be manufactured integral with a printed circuit board by plating the resistors onto the insulative substrate. Uniformization of the insulative substrate through etching and oxidation of the plated resistor are discussed as techniques for improving the uniformity and consistency of the plated resistors. Trimming and baking are also disclosed as methods for adjusting and stabilizing the resistance of the plated resistors.

39 Claims, 2 Drawing Sheets

METHOD FOR THE MANUFACTURE OF PRINTED CIRCUIT BOARDS WITH PLATED RESISTORS

FIELD OF INVENTION

The present invention relates to a process for the manufacture of double-sided or multilayer printed circuit boards with printed plated resistors. The method proposed produces printed circuits with integral resistors, which are printed and plated in place on the surfaces of the printed circuit board, or on the inner cores of multilayer printed circuit boards thereby opening the area on the surface of the board for placement of active devices. The process produces printed circuit boards with resistors in a manner that is more efficient and economical than previously possible.

BACKGROUND OF THE INVENTION

In the manufacture of printed circuits, it is now commonplace to provide planar boards having circuitry on each side thereof (e.g. double-sided circuit boards). It is also commonplace to produce boards comprised of integral planar laminates of insulating substrate and conductive metal, wherein one or more parallel innerlayers or planes of the conductive metal, separated by insulating substrate, are present within the structure, with the exposed outer surfaces, along with the inner planes, of the laminate containing printed circuit patterns (e.g. multilayer circuit boards).

In double sided and multilayer circuit boards, it is necessary to provide interconnection between or among the various layers and/or sides of the board containing the conductive circuitry. This is achieved by providing metalized, conductive thru-holes in the board communicating with the sides and layers requiring electrical interconnection. The predominantly employed method for providing conductive thru-holes is by electroless deposition of metal on the non-conductive surfaces of the thru-holes, which have been drilled or punched through the board. Typically the electroless deposition is followed by electrolytic deposition of metal in the holes to build conductive metal to the required thickness. Recently some processes have allowed for direct electroplating in the thru-holes without need for prior electroless deposition.

The typical manufacturing sequence for producing printed circuit boards begins with a copper-clad laminate. The copper clad laminate comprises a glass reinforced epoxy insulating substrate with copper foil adhered to both planar surfaces of said substrate, although other types of insulating substrates such as paper phenolic and polyimide, have been used. First the thru-holes are drilled or punched in the copper clad laminate thereby exposing the hole surfaces of insulating substrate material. The holes are then subjected to a chemical plating process which deposits conductive metal in the holes as well as on the copper surfaces. A plating mask is provided on the outer surfaces in the negative image of the circuitry desired. Subsequently copper is electroplated on all surfaces, not covered by the plating mask, to a predetermined thickness, followed by a thin deposition of tin to act as an etch resist. The plating resist is then stripped and the exposed copper surfaces (i.e., those not plated with the etch resist) are etched away. Finally the etch resist is removed and printed circuit board is finished with one of a number of known finishing methods such as solder mask, followed by hot air solder leveling. The foregoing process is typically called the pattern plate process and is suitable for producing double-sided printed circuit boards or multilayer boards. However, in the case of multilayer boards the starting material is a copper clad laminate which comprises inner planes of circuitry called innerlayers.

Simple printed circuit boards and the innerlayers of a multilayer circuit board are produced through a technique called print and etch. In this manner a photopolymer is laminated or dried on the copper surfaces of a copper clad laminate. The photopolymer is then selectively imaged using a negative and developed to produce a positive image of the desired circuit pattern on the surfaces of the copper clad laminate. The exposed copper is then etched away and the photopolymer stripped, revealing the desired circuit pattern.

The semi-additive process may be used in conjunction with the print and etch process to produce double sided or multilayer print and etch boards with plated thru-holes. In this process a copper clad laminate or a multilayer package with copper foil on the exterior surfaces is processed through the print and etch process as given above. Holes are then drilled in the board in a desired array. A plating resist applied to cover substantially the entire outer surfaces of the board except for the holes and the circuits. Typically, a separate desensitizing mask is applied, the holes are activated and the desensitizing mask is then stripped away without disturbing the activation. The exposed areas are then plated electrolessly.

In addition to the foregoing, many other processes have been utilized to produce printed circuit boards. Some of these processes are detailed in U.S. Pat. Nos. 3,982,045, 4,847,114 and 5,246,817, the teachings each of which are incorporated herein by reference in their entirety. However, in the prior art processes, the circuits are made such that resistors, if required, need to be provided externally from the circuit board itself. (e.g. mounted on the surface of the circuit board as an appendage).

A process whereby reliable resistors can be printed and plated as an integral part of the circuitry of the printed circuit board is disclosed herein. This provides for an efficient and economical way of providing the necessary resistors. In addition the process provides for further miniaturization of the printed circuit boards produced in comparison to those produced by prior art methods. Typical prior art in this regard are U.S. Pat. Nos. 3,808,576 and 2,662,957, the teachings both of which are incorporated by reference herein in their entirety. This invention produces printed circuits with integral resistors, which resistors have a particularly constant resistance as is required by the most demanding applications.

BRIEF DESCRIPTION OF THE FIGURES

Collectively the figures visually show the steps of the basic process of this invention.

SUMMARY OF THE INVENTION

Figure 1A:
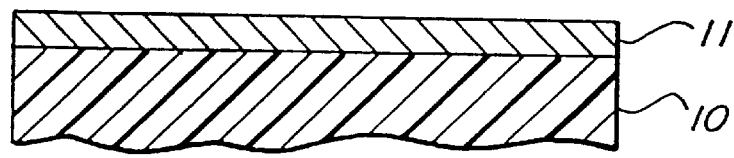
FIG. 1A represents one side of the copper clad laminate (although both sides would most likely be processed in the same way) with insulating dielectric substrate, 10, and the attached copper foil, 11.
Figure 1B:
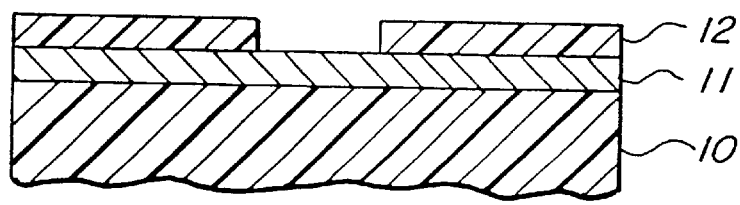
FIG. 1B indicates the presence of an imaged resist, 12, on the copper foil, 11. The resist, 12, has already been imaged and developed and therefore covers only the desired portions of the copper foil, 11.
Figure 1C:
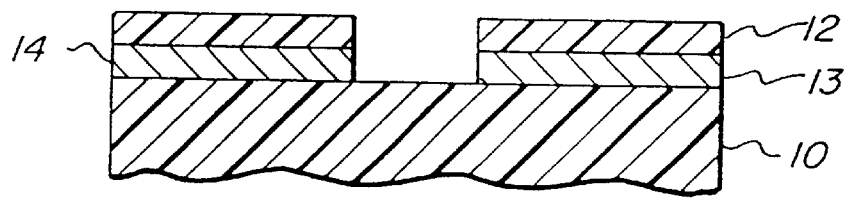
FIG. 1C indicates that the exposed copper has now been etched away leaving unconnected resist covered copper traces, 13 and 14 on the substrate, 10.
Figure 1D:
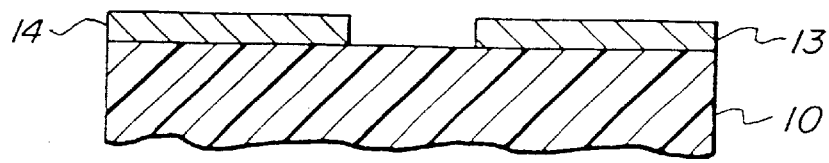
FIG. 1D indicates that the resist has now been completely stripped away leaving only the desired copper traces, 13 and 14 on the substrate, 10.
Figure 1E:
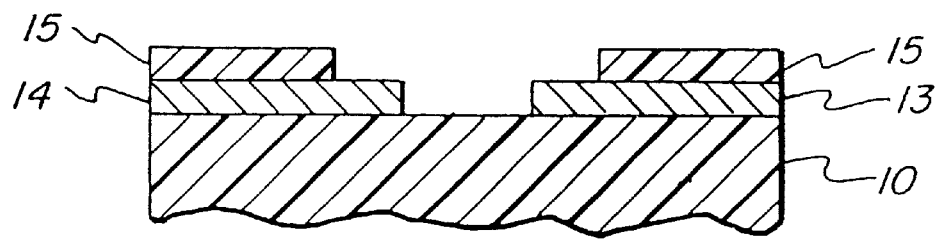
FIG. 1E shows the application of a plating resist, 15, which covers the entire area of the board except the portions where the resistor will be plated.
Figure 1F:
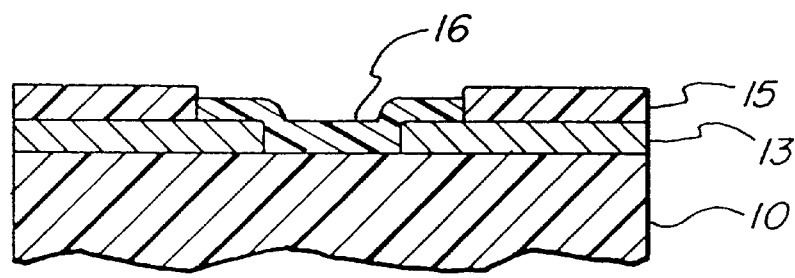
FIG. 1F shows the plated resistor, 16, connecting the previously unconnected copper traces, 13 and 14.
Figure 1G:
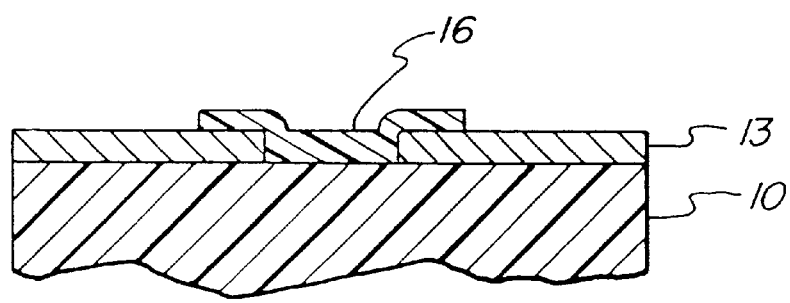
FIG. 1G shows the circuit after the plating resist has been stripped away.

The current invention proposes a process for printing and plating resistors as an integral part of a printed circuit board. The foregoing process is described in its basic form by the following sequence of processing steps:

a). Apply an etch resist (12) onto the copper foil (11) surface of a metal clad laminate (or multilayer package) in a desired pattern. The desired pattern should preferably define the conductive circuits desired in a positive manner and should define the areas between the circuits and locations for the resistors in a negative manner;

b). Etch away the exposed copper and preferably remove the etch resist to form unconnected copper traces (13 and 14);

c). Activate the surfaces to accept plating thereon;

d). Apply a plating mask (15) which covers substantially all of the surfaces except for the areas where the resistors are to be plated;

e). Plate the exposed areas with a resistive material (16); and f). Strip away the plating mask.

As an equivalent to the foregoing process, foregoing steps a and b can be replaced by an additive process with the following steps:

a.1.). Activate the surfaces of a bare dielectric substrate to accept plating thereon;

a.2.). Apply a plating mask to the dielectric substrate such that the desired circuits are defined in a negative manner and the areas between the circuits and the locations for the resistors are defined in a positive manner;

a.3.) Plate the desired circuitry;

a.4.) Strip away the plating resist; and

Subsequently follow steps (c) through (f) noted previously.

In a preferred embodiment the substrate is subjected to a dielectric etchant after step b but before step c in order to uniformize the dielectric surface. Etching at this point to uniformize the dielectric surface will provide plated resistors with more constant and predictable resistance.

In another preferred embodiment, the plated resist material is contacted with an oxidant between steps (e) and (f) or after step (f). Contacting the plated resist material with an oxidant, and thereby oxidizing the plated resist material in a controlled manner provides plated resistors with more constant and predictable resistance and optionally with higher resistance if desired. Intrinsic resistance increases via controlled oxidation. Alternatively, or in addition, the resistors can be baked a this point, after step f, to stabilize the resistance of the resistors In a third preferred embodiment, the printed circuit board is subjected to a cleaning step after step (f) in order to remove any residual activator species from step (c) and to otherwise improve the surface insulation resistance of the board in general. The inclusion of this step produces printed circuit boards with higher reliability.

Finally trimming is suggested as a method for adjusting the insulation resistance of the plated resistors to within a prescribed range of insulation resistance (ohms). Ablating portions of the plated resistor using laser light is a particularly preferred method of trimming.

DETAILED DESCRIPTION OF THE INVENTION

The processes described herein provide a method of forming a resistor between two conductive areas, which areas are upon and separated by an insulating substrate. The method described provides for plating a resistive material onto the insulating substrate, which is between the conductive areas, such that the resistive material connects the conductive areas. The processes described are particularly useful in producing printed circuit boards with plated resistors which are integral with the circuits. The most basic processing sequence is described as follows:

a). apply an etch resist onto the surfaces of a metal clad laminate such that the resist defines the desired circuits in a positive manner and the areas between the circuits, including the locations for the resistors, are defined in a negative manner;

b). etch away exposed copper surfaces and preferably strip the etch resist;

c). optionally, treat the exposed dielectric surfaces with a process selected from the group consisting of chemical etching, plasma etching, laser normalization, vapor blasting, sanding, shot blasting and sand blasting;

d). activate the exposed dielectric surfaces to accept plating thereon;

e). apply a plating resist such that the plating resist covers all or substantially all of the surfaces except for the areas where the resistors are to be plated (i.e. such that the resistor areas are defined in a negative manner;

f). plate the exposed areas;

g). optionally, contact the plated areas with an oxidant;

h). strip away the plating mask;

i). optionally clean the surfaces of the printed circuit board;

j). optionally, bake the resistors;

k). optionally, trim portions of the plated resistor material such that the final insulation resistance of the resistors falls within a predetermined range of insulation resistance; and l). optionally, coat the resistors with a protective coating.

Steps (a) and (b) together call for the creation of defined circuitry on the surfaces of a metal clad dielectric laminate (or multilayer package-several layers of circuitry containing one or more innerlayers of circuitry which have been laminated into a single planar package). The innerlayers may or may not contain the plated resistors of this invention. If so, then the innerlayers may be fabricated by the process described herein. Collectively metal clad dielectric laminate and multilayer packages are referred to as metal clad laminate. The metal clad laminate may optionally have thru holes in it in a desired array. The thru holes may or may not be plated at this point. The key here is the definition and creation of circuit patterns on the surfaces of the metal clad laminate along with the definition and creation of specific breaks in the circuitry where the resistors will be plated (the "resistor areas"). The length and width of the specific resistor areas will obviously directly impact the resistance achieved after plating.

The definition and creation of circuitry and the resistor areas can be accomplished in many ways. The most prevalent way is through the subtractive process as described in current steps (a) and (b). In the subtractive process, a metal (usually copper) clad laminate is used. The metal clad laminate comprises a planar dielectric substrate with metal foil adhered to both exterior surfaces. As discussed, the dielectric substrate is typically glass reinforced epoxy, but can also be a variety of other insulative materials known in the art. In any case, a resist pattern is applied to the metal surfaces of the metal clad laminate such that the resist defines the circuits in a positive manner, and the areas between the circuits and the resistor areas in a negative manner. The most typical way of accomplishing this is to use a photoresist. In this case the photoresist is applied to the metal surfaces in either liquid or dry form. The photoresist is then selectively exposed to actinic radiation through a negative. The unexposed areas of the resist are developed away revealing the desired pattern. As an alternative, the resist may be screened onto the metal surfaces directly in the desired pattern. After the circuits are defined with the resist, the exposed copper areas are etched away and the resist is stripped revealing the circuits. Thus the areas between the circuits and the resistor areas are now bare dielectric.

Step (c) is optional, but recommended. In order for the resistors to be usable and reliable, the resistance must be predictable, relatively constant and reliable. In order to achieve plated resistors with particularly predictable, relatively constant and reliable resistance, the dielectric surface to be plated with the resistive material to form the resistor must be uniform. Dielectric surface uniformity and predictable, relatively constant and reliable resistance of the plated resistors can be accomplished by uniformizing the dielectric surface upon which the resistor is to be plated. Uniformizing can be achieved in several ways such as vapor blasting, chemical etching, plasma etching, laser normalization or mechanical uniformization. Mechanical uniformization can be achieved by sanding, sand blasting or shot blasting. Surface uniformization through chemical etching is generally the most reliable and efficient means. The particular etchant used in this regard must be matched with the dielectric being used. However, if glass reinforced epoxy is used, the inventors have found that alkaline permanganate, concentrated sulfuric acid, chromic acid or plasma to be particularly useful in etching and uniformizing the surface of the dielectric. Solutions of sodium or potassium permanganate at concentrations in excess of 50 grams/liter, in 10% by weight caustic solution, at temperatures in excess of 140° F. and for times of 2 to 20 minutes are preferred in this regard. If permanganates are used in this regard they may be preceded with a swellant or sensitizer which makes the dielectric more susceptible to the permanganate etch. A typical swellant for epoxy is m-pyrol applied full strength at from 90–120° F. for from 1 to 5 minutes. In addition the permanganate etch is typically followed by an acid reducing solution which will remove the permanganate residues.

Step (d) involves activating the surfaces to be plated. Activation of the surfaces can range in complexity from a single dip in a precious metal activator (or non-precious metal or other activators know in the art) to a full plating cycle involving numerous steps. Typically the activation process will begin with a conditioner (surfactant or other type), followed by an activator ($PdCl_2/SnCl_2$ Colloid, or ionic solution of palladium or another precious metal) and an accelerator. If an accelerator is used, the inventors have found that it is preferable to apply the accelerator solution, immediately prior to step (f) (i.e. the plating of the resistors). Electroless plating accelerators are generally known in the art and include simple solutions of hydrochloric or fluoboric acid or alkaline solutions of sodium chlorite. Clean water rinses are interposed between each chemical treatment. Regardless of the activation cycle chosen, its primary purpose is to treat the surfaces such that they initiate and accept plating. A wide variety of methods for achieving this are known in the art, any of which may be advantageously utilized here. Please refer to U.S. Pat. Nos. 5,032,427 (Kukanskis, et al.), 4,976,990 (Bach et al.) and 4,863,758 (Rhodenizer), the teachings of which are incorporated herein by reference in their entirety. The inventors have found it beneficial to dry the metal clad laminate after the activation cycle of step (d).

In step (e) a solid or liquid plating mask is applied such that the resistor areas are defined in a negative manner. Generally, to accomplish this, the plating mask covers all or substantially all of the surfaces except for the resistor areas. The plated resistors are more reliable if the plating mask allows for some plating overlap where the resistive plating meets the conductive circuit as opposed to covering all of the circuit with plating mask and causing the resistive plating to merely abut the conductive circuit. In any case, the plating mask can be any typical plating mask known in the art as long as it maintains its integrity in the subsequent plating bath. The plating mask may be screened onto the surface in the desired pattern or blanket coated, photoimaged and developed. In applying a solid plating mask to the surface, the inventors have found vacuum lamination to be particularly useful in insuring that the mask conforms closely to the three dimensional features of the surface.

Step (f) involves plating the resistors. At this stage the plating will occur only on the areas not covered by the plating mask which was applied in step (e) (i.e. the resistor areas, preferably with some overlap onto the circuits where the resistor connects to the circuits). A variety of plating baths can be advantageously utilized. Electroless nickel-phosphorous, (or alloys thereof) electroless precious metal plating baths, including palladium-phosphorous, or ruthenium-phosphorous (or alloys of any of the foregoing) electroless plating baths, are particularly useful in this regard. It may be optionally desirable to clean and/or accelerate the surfaces immediately prior to plating.

Obviously, the thickness of the metal plated has a direct impact on the resistivity of the resultant resistor. The inventors have found that typically it is advantageous to plate metal thickness in the range of from 0.05 to 2.5 microns, preferably from 0.10 to 1.0 microns and most preferable from 0.10 to 0.50 microns. Plating advantageously takes 2 to 3 minutes, more preferably 5 to 10 minutes depending upon the plating bath used and the ultimate resistance desired.

Depending upon the ultimate resistance desired, the following factors may be adjusted to vary the resistivity of the resultant resistor: type of metal plated, thickness of the metal plated, length of the resistor, width of the resistor and subsequent treatment of the resistor. With regard to type of metal plated, the phosphorous content of the nickel-phosphorous, palladium phosphorous, or the ruthenium-phosphorous, will affect the resistivity of the final deposit. All of the foregoing factors may be varied to achieve the ultimate resistance desired. The inventors have found that the intrinsic resistance of the nickel, palladium or ruthenium plated increases with the phosphorous content of the metal. They have also found it most advantageous to plate the resistors with nickel having a phosphorous content of 10–13% by weight and palladium with a phosphorous content of 2–8% by weight. The inventors have found that high phosphorous containing metals, particularly nickel or palladium, produce a plated coating with relatively high intrinsic resistance. Therefore, for any given desired ultimate resistance for the resistor, a greater thickness of material (holding length and width constant) can be plated, thereby yielding more reliable plated resistors. This also allows for commercially acceptable plating times in the range of 2–3 minutes. Plating times of less than 2–3 minutes are too short to easily control in a commercial process with reliability, thereby producing relatively unreliable plated resistors. If resistors of different resistance's are required on the same circuit board, then steps (e) and (f) or (d), (e) and (f) can be repeated to plate different resistors with different thickness of resistive material or with different resistive material. Alternatively, of course, other variables such as length and width of the resistors can be varied without repeating any steps.

Step (g) optionally provides for controlled oxidation of the plated resistor metal preferably by controlled chemical oxidation. Controlled oxidation is a method for increasing the resistivity of the plated resistor and more importantly of providing for more predictable resistance on a consistent basis. In this regard a variety of oxidants may be used including potassium iodate, which is preferred. If potassium iodate is used, an aqueous solution with from 10–75 gr/l potassium iodate at a temperature of 90° C. and for a time of 5 minutes has proven effective. The higher intrinsic resistance materials allow for greater thickness of plated material (other variables constant), more reliable plated resistors and commercially acceptable plating times. Increases in intrinsic resistance of the plated metal of from 20 to 400 percent based upon the intrinsic resistance of the same unoxidized metal can be achieved.

Step (h) involves stripping away the plating mask. A stripping solution must be chosen to match the plating mask used. Typical plating masks can be stripped away in alkaline solution, however some require organic solvents.

In step (i), it is optionally advantageous to clean the surfaces of the printed circuit board in order to remove any residual activator and to increase the surface resistance of the board. U.S. Pat. Nos. 5,221,418; 5,207,867; and 4,978,422, the teachings each of which are incorporated herein by reference in their entirety, all teach various means of cleaning and increasing the surface resistance of boards as is suggested by step (i) herein. Care must be taken such that the resistance of the plated resistor is not affected by the foregoing cleaning. It may be advantageous to protect the plated resistors, prior to cleaning the board, through use of a coating of some type, permanent or non-permanent. Thus, step (i) may be conducted after step (h) as shown or may be conducted after step (l) when the resistors have been coated with an appropriate protective coating. However, unless the resistors are protected, no further chemical processing should preferably occur after trimming, since further processing may affect the insulation resistance of the resistors.

As stated, it is typically of great importance that the resistivity of the plated resistors be predictable and constant over time. The inventors have discovered that subsequent processing of the printed circuit boards can cause the resistance of plated resistors to change. In particular, the lamination and soldering processes can permanently change the resistance of the resistors. In addition, the inventors have found that baking the resistors after they have been plated can stabilize the resistance of the resistors such that changes in resistance due to subsequent processing are minimized. Thus, the inventors prefer to bake the plated resistors from 30 minutes to 3 hours at from 100° F. to 400° F., preferably for 30 minutes to 1.5 hours at from 300° F. to 400° F., in order to stabilize the resistance of the resistors and minimize any subsequent changes therein. Any change in resistance as a result of baking the resistors, or other subsequent processing, must be anticipated in designing the resistors. Final changes in the insulation resistance of the plated resistor can be achieved through trimming.

After baking, or after plating if baking is not desired, the resistance of the plated resistors can be measured and adjusted, if necessary, by trimming. Trimming is a method of increasing the insulation resistance of the plated resistors to a predetermined or specified resistance value by trimming, or removing, in a controlled fashion, a portion of the plated resistor such that the specified insulation resistance value is achieved for the device. The trimming or controlled removal is typically accomplished by use of lasers. In this regard, lasers are used to ablate portions of the plated resistor in a precise and controlled manner such that the desired resistance is achieved. Plated resistors are particularly amenable to this form of laser ablation since the plated films are generally relatively thin (i.e., about 5 to 25 microinches). In the alternative, the plated resistors can be trimmed using any method which can reliably remove portions of the plated resistor in a controlled manner. Most preferably, the trimming step will occur as close to the end of the printed circuit processing as possible in order to minimize the possibility of the resistance value changing.

Finally, it is usually desirable to coat the surfaces of the board, including the plated resistors, with a protective coating such as a soldermask. Soldermasks are desirable for the protection of the board in subsequent processing and to enhance the durability of the resulting product. Typical solder mask processing is described in U.S. Pat. No. 5,296,334, the teachings of which are incorporated herein by reference in their entirety.

Resistivity is the inverse value of conductivity. It is commonly expressed by volume resistivity, surface resistivity and/or insulation resistance as provided for under ASTM D 257. Volume resistivity is the resistance between the faces of a unit cube and is equal to V=AR/X were V is the volume resistivity expressed in ohms-cm, A is the cross sectional area of the electrical path ($cm^2$), R is the measured resistance (ohms), and X is the length of the electrical path. Values for volume resistivity for the resistors plated as described in this invention can range from about 500 to about $1 \times 10^{-4}$ ohm-cm, and preferably range from about 5 to about $5 \times 10^{-4}$ ohm-cm, most preferably range from about $1 \times 10^{-2}$ to about $1 \times 10^{-3}$ ohm-cm. Surface resistivity is the ability of an insulator to resist the flow of a current in its surface and is equal to S=PR/d where S is the surface resistivity expressed in ohms/square, P is a parameter of the guarded electrode (cm) given in ASTM D 257, R is the measured resistance (ohms) and D is the distance between the electrodes (cm). Insulation resistance is measured on a specific device or configuration and is the integrated effect of volume and surface resistivity. Insulation resistance is usually expressed in ohms and relates to a specific device or configuration. The resistors plated as described in this invention have an insulation resistance which ranges from about 1 to about 10,000 ohms, preferably from about 10 to about 1,000 ohms.

In applying the foregoing principles to a particular plated resistor with a particular desired design resistance (i.e. insulation resistance) the following equation is useful:

$$R = \frac{VX}{A}$$

where R=the overall desired resistance of the specific plated resistor (i.e. its insulation resistance).

V=volume resistivity of the plated deposit and is generally approximately constant for a particular plating solution.

X=plated resistor length

A=plated resistor cross sectional area (width×thickness)

A typical example may require a plated resistor of 0.005 inches in width, 0.005 inches in length and an overall desired resistance of 275 ohms±15 ohms. Using a plating solution that deposits a modified electroless nickel-phosphorous deposit with a volume resistance of about $7 \times 10^{-3}$ ohm-cm and depositing a thickness of 10 microinches of the foregoing electroless nickel, a resistor of the desired overall resistance may be obtained as follows:

$$R = \frac{(0.007 \text{ ohm-cm})(0.005 \text{ in})}{5 \times 10^{-8} \text{ in}^2} \times \frac{1 \text{ in}}{2.54 \text{ cm}}$$

R=276 ohms

If further increases in resistance are required, then the so plated deposit may be oxidized as discussed herein. It should be noted that the key to reproducible results in this regard is surface normalization prior to plating said surface and baking the plated resistors until resistance stabilization is achieved, all as discussed herein. Post oxidation of the deposit can also increase resistance and improve reproducibility. Necessary adjustments to the resistance of the plated resistors can be made by trimming as noted herein.

For comparison purposes, the volume resistivity of plated copper circuitry or copper plated through holes on a printed circuit board is typically less than about $5 \times 10^{-5}$ ohm-cm and can preferably range from about $1 \times 10^{-6}$ to about $1 \times 10^{-8}$ ohm-cm. The volume resistivity of the insulative substrate of an FR-4 epoxy-glass printed circuit board is typically greater than about $10^9$ ohm-cm and can preferably range from about $10^9$ to about $10^{20}$ ohm-cm.

With the pace of minaturization of electronic devices, the surface area of printed circuit boards has become more compacted and more valuable. As a result, the overall size of resistors plated in accordance with this invention must fit the size requirement of ever-shrinking printed circuit boards. Plated resistors, prepared in accordance with this invention, with volume resistivity in the range of 500 to $1 \times 10^{-4}$ ohm-cm can be formed with lengths ranging from about 0.002 in. to about 1.0 in., preferably from about 0.005 to about 0.20 in., most preferably from about 0.005 to about 0.080 in. with widths ranging from about 0.002 to about 1.0 in., preferably from about 0.005 to about 0.20 in., most preferably from about 0.005. to about 0.080 in. and with thickness ranging from about 2 to about 300 microinches, preferably from about 5 to about 100 microinches and most preferably from about 5 to about 25 microinches. Typically, the foregoing length and width dimensions are imaged dimensions (i.e. dimensions of the imaged plating mask in the area to be plated with resistive material). Actual dimensions of the plated resistor may vary somewhat.

The following examples are presented for illustrative purposes only and should not be taken as limiting in any way:

EXAMPLE I

Copper clad glass reinforced epoxy laminates were processed through the following sequence:

1. A dry film resist (Aquamer CF-1.5 available from MacDermid, Inc.) was laminated to both copper surfaces of copper clad laminate. The resist was then selectively exposed to ultraviolet light by exposure through a negative. The negative was designed such that the ultraviolet light impinged upon the circuit areas only. (i.e. circuits defined in a positive manner and the areas between circuits and resistor areas are defined in a negative manner) The unexposed portions of the resist were developed away using a 1% by weight potassium carbonate solution at 90° F. for 30 seconds.

2. The exposed copper surfaces were etched away by spraying ammoniacal copper chloride etchant at 110° F. onto the surfaces until the exposed copper was cleanly etched away. The resist was then stripped away in a 10% by weight caustic solution.

3. The surfaces were activated to accept plating thereon by the following process sequence:
   a). MacDermid M-Conditioner, 110° F., 2 minutes
   b). MacDermid M-Preactivator, 75° F., 2 minutes
   c). MacDermid M-Activator, 100° F., 5 minutes Clean water rinses were interspersed between each of the foregoing steps.

4. MacDermid Viatek PM#4 plating mask was then screened onto the surfaces such that it covered all of the surfaces except for the areas where the resistors were to be plated (the "resistor areas") (i.e. such that the resistor areas were defined in a negative manner). The plating mask was then baked to cure for 5 minutes at 250° F. The width and length of the resistor areas, resistivity of electroless palladium-phosphorous, and the thickness of the palladium-phosphorous plate were used to design and predict the ultimate resistance of the plated resistors.

5. The resistor areas were then plated by immersion in MacDermid Pallas 52 electroless palladium-phosphorous plating bath, which was prepared per the supplied data sheet, at 150° F. for 5 minutes. Approximately 0.1 to 0.2 microns of electroless palladium-phosphorous were plated.

6. The plating mask was then stripped away using a 10% by weight caustic solution at 150° F. for 2 minutes and then thoroughly rinsed.

The laminates were then electrically tested to determine the actual resistance of the plated resistors and the actual resistance was compared to the design resistance. Variances of 25–30% were recorded.

EXAMPLE II

Copper clad glass reinforced epoxy laminates were processed through the same sequence as in Example I except that after step 2 and before step 3 the following additional processing was inserted:

a). M-Pyrol, 100% be weight, 90° F., 2 minutes
b). Potassium permanganate, 60 gr/l, 10% by weight caustic soda, 160° F., 10 minutes
c). 10% by weight hydrochloric acid, 5 gr/l hydroxylamine sulfate, 110° F., 5 minutes.

The laminates were then electrically tested to determine the actual resistance of the plated resistors and the actual resistance was compared to the design resistance. Variances of 8–10% were recorded.

The laminates were further processed by interleaving glass-reinforced epoxy pre-preg sheets between several laminates and between the laminates and copper foil capping sheets, resulting in a multilayer package. The multilayer package was then subjected to heat and pressure in order to melt and cure the interleaved pre-preg layers. The actual laminates were then again electrically tested, after isolating the resistors, to determine the actual resistance of the plated resistors and the actual resistance was compared to the design resistance. Variances of 20–30% were recorded.

EXAMPLE III

Copper clad glass reinforced epoxy laminates were processed through the same sequence as in Example II except that at the end of the processing as indicated in Example II, the following sequence was performed:

The resistors were oxidized by immersing the boards in an aqueous solution of 40 gr/l of potassium iodate at 90° C. for 5 minutes.

The laminates were then electrically tested to determine the actual resistance of the plated resistors (without subsequent lamination). Actual resistance has increased by 300% as compared to the unoxidized resistors of Example II. Variances of 5 to 10% were recorded.

EXAMPLE IV

Copper clad glass reinforced epoxy laminates were processed through the same sequence as in Example II, except that after Step 6, the laminates were baked at 350° F. for one hour.

The laminates were then electrically tested to determine the actual resistance of the plated resistors and the actual resistance was compared to the design resistance. Variances of 5–10% were recorded.

The laminates were further processed by interleaving glass reinforced epoxy pre-preg sheets between the several laminates and between the laminates and copper foil capping sheets, resulting in a multilayer package. The multilayer package was then subjected to heat and pressure in order to melt and cure the interleaved pre-preg layers. The actual laminates were then again electrically tested, after isolating the resisters, to determine the actual resistance of the plated resisters and the actual resistance was compared to the design resistance. Variances of 5–10% were recorded.

What is claimed is:

1. A method of forming a resistor between two metallic circuit traces, which circuit traces have a volume resistivity less than about $5 \times 10^{-6}$ ohm-cm, and which circuit traces are upon and separated by an insulative substrate, which insulative substrate has a volume resistivity greater than about $1 \times 10^9$ ohm-cm, which method comprises plating a resistive material, which resistive material has a volume resistivity of from about 500 to about $1 \times 10^{-4}$ ohm-cm, onto an area of the insulative substrate between the circuit traces, such that the resistive material connects the circuit traces and then trimming a portion of the resistive material from the insulative substrate such that the resistor has an insulation resistance equal to a predetermined amount of ohms.

2. A method according to claim 1, wherein the insulative substrate between the circuit traces is treated with a process selected from the group consisting of chemical etching, plasma etching, laser normalization, vapor blasting, sanding, shot blasting and sand blasting prior to plating the resistive material thereon.

3. A method according to claim 1, wherein the resistive material is subjected to a process selected from chemical oxidation, baking, and both of the foregoing processes, after being plated.

4. A method according to claim 1, wherein the resistive material comprises a material selected from the group consisting of electroless nickel-phosphorous, electroless palladium-phosphorous, electroless ruthenium-phosphorous, and alloys of any of the foregoing.

5. A method according to claim 1, wherein the trimming is accomplished by contacting at least portions of the resistive material with laser light such that at least portions of the resistive material are ablated or otherwise removed by such contact.

6. A method according to claim 2, wherein the resistive material is subjected to a process selected from chemical oxidation, baking, and both of the foregoing processes, after being plated.

7. A method according to claim 2, wherein the resistive material comprises a material selected from the group consisting of electroless nickel-phosphorous, electroless palladium-phosphorous, electroless ruthenium-phosphorous, and alloys of any of the foregoing.

8. A method according to claim 2, wherein the resistive material is plated to a thickness of from about 2 to 300 microinches.

9. A method according to claim 4, wherein the resistive material selected from the group consisting of electroless nickel-phosphorous with a phosphorous content in the plated resistive material of at least 10% by weight and electroless palladium-phosphorous with a phosphorous content in the plated resistive material of at least 2% by weight.

10. A method for manufacturing a printed circuit board with integral plated resistors which method comprises:

a). applying an etch resist onto portions of the metal surfaces of a metal clad laminate, which laminate comprises a polymer based core with metal cladding thereupon, such that the resist defines desired circuits in a positive manner and areas between the circuits, including the locations for the resistors, in a negative manner thereby creating exposed metal surfaces and resist covered metal surfaces;

b). etching away the exposed metal surfaces thereby yielding metal circuits separated by exposed areas of the polymer based core;

c.) stripping the resist;

d). activating at least portions of the exposed areas of the polymer based core to accept plating thereon;

e). applying a plating mask such that the plating mask covers all or substantially all of the surfaces of the metal clad laminate except for the locations for the resistors;

f). plating areas not covered by the plating mask with a resistive material which has a volume resistivity of from about 500 to about $1 \times 10^{-4}$ ohm-cm;

g). stripping away the plating mask; and h). trimming at least a portion of the resistive material from the insulative substrate such that each resistor has an insulation resistance equal to a predetermined amount of ohms.

11. A method according to claim 10, wherein the resistive material is subjected to a process selected from chemical oxidation, baking and both of the foregoing processes after being plated.

12. A method according to claim 10, wherein the trimming is accomplished by contacting at least portions of the resistive material with laser light such that at least portions of the resistive material are ablated or otherwise removed by such contact.

13. A method according to claim 10, wherein the printed circuit board is cleaned subsequent to step (g).

14. A method according to claim 10, wherein a permanent protective coating is applied to the printed circuit board subsequent to step (h).

15. A method according to claim 10, wherein the resistive material is plated to a thickness from about 2 to 300 microinches.

16. A method according to claim 10, wherein the resistive material is selected from the group consisting of electroless nickel-phosphorous, electroless palladium phosphorous, electroless ruthenium-phosphorous, and alloys of any of the foregoing.

17. A method according to claim 16, wherein the resistive material is selected from the group consisting of electroless nickel-phosphorous with a phosphorous content in the plated resistive material of at least 10% by weight and electroless palladium-phosphorous with a phosphorous content in the plated resistive material of at least 2% by weight.

18. A method of forming a resistor between two metallic areas, which metallic areas are upon and separated by an insulative substrate, which insulative substrate has a volume resistivity of from about $10^9$ to about $10^{20}$ ohm-cm, and which method comprises plating a resistive material, which resistive material has a volume resistivity of from about 500 to about $1\times10^{-4}$ ohm-cm, onto a portion of the insulative substrate which is between the metallic areas, such that the resistive material connects the metallic areas, and thereafter trimming at least a portion of the resistive material from the insulative substrate such that the resistor has an insulation resistance equal to a predetermined amount of ohms.

19. A method according to claim 18, wherein the conductive areas are circuits on a printed circuit board.

20. A method according to claim 18, wherein the resistive material comprises a material selected from the group consisting of electroless nickel-phosphorous, electroless palladium-phosphorous, electroless ruthenium-phosphorous, and alloys of any of the foregoing.

21. A method according to claim 18, wherein the trimming is accomplished by contacting at least portions of the resistive material with laser light such that at least portions of the resistive material are ablated or otherwise removed by such contact.

22. A method according to claim 20, wherein the resistive material is selected from the group consisting of electroless nickel-phosphorous with a phosphorous content in the plated resistive material of at least 10% by weight and electroless palladium-phosphorous with a phosphorous content in the plated resistive material of at least 2% by weight.

23. A method for manufacturing a printed circuit board with integral plated resistors which method comprises:
  a.) applying an etch resist onto portions of the metal surfaces of a metal clad laminate, which laminate comprises a polymer based core with metal cladding thereupon, such that the resist defines the desired circuits in a positive manner and the areas between the circuits, including locations for the resistors, in a negative manner, thereby creating exposed metal surfaces and resist covered metal surfaces;
  b.) etching away the exposed metal surfaces thereby yielding metal circuits separated by exposed areas of the polymer based core;
  c.) stripping the resist;
  d.) activating at least portions of the exposed areas of the polymer based core to accept plating thereon;
  e.) applying a plating mask such that the plating mask covers all or substantially all of the metal clad laminate except for locations for the resistors;
  f.) plating areas not covered by the plating mask with a resistive material to form resistors;
  g.) trimming at least a portion of the resistive material such that each resistor has a resistance equal to from about 10 to about 1000 ohms, a length of from about 0.005 inches to about 0.20 inches, a width of from about 0.005 inches to about 0.20 inches and a thickness of from about 5 to about 100 microinches.

24. A method according to claim 23, wherein the resistor is subjected to a process selected from the group consisting of chemical oxidation, baking and both of the foregoing processes after being plated.

25. A method according to claim 23, wherein the printed circuit board is cleaned subsequent to step (f).

26. A method according to claim 23, wherein the resistive material is selected from the group consisting of electroless nickel-phosphorous, electroless palladium-phosphorous, electroless ruthenium-phosphorous, and alloys of any of the foregoing.

27. A method according to claim 23, wherein a permanent protective coating is applied to the printed circuit board subsequent to step (g).

28. A method according to claim 23, wherein the resistors overlap onto the metal circuits.

29. A method according to claim 23, wherein the resistors have a length of from about 0.005 to 0.080 inches, a width of from about 0.005 to 0.080 inches and a thickness of from about 5 to 25 microinches.

30. A method according to claim 23, wherein the trimming is accomplished by contacting at least portions of the resistive material with laser light such that at least portions of the resistive material are ablated or otherwise removal by such contact.

31. A method according to claim 23, wherein the resistive material is subjected to a process selected from chemical oxidation, baking and both of the foregoing processes after being plated.

32. A method according to claim 26, wherein the resistive material is selected from the group consisting of electroless nickel-phosphorous with a phosphorous content in the plated resistive material of at least 10% by weight and electroless palladium-phosphorous with a phosphorous content in the plated resistive material of at least 2% by weight.

33. A method of forming a resistor between two metallic areas, which metallic areas are upon an separated by an insulative substrate, which insulative substrate has a volume resistivity of from about $10^9$ to about $10^{20}$ ohm-cm, and which method comprises plating a resistive material, which resistive material has a volume resistivity of from about 500 to about $1\times10^{-4}$ ohm-cm, onto a portion of the insulative substrate which is between the metallic areas, such that the resistive material connects the metallic areas and thereafter, heating the resistive material to at least about 100° F. for at least about 30 minutes.

34. A method according to claim 33, wherein the resistive material comprises a material selected from the group consisting of electroless nickel-phosphorous, electroless palladium-phosphorous, electroless ruthenium-phosphorous, and alloys of any of the foregoing.

35. A method according to claim 33, wherein the insulative substrate between the metallic areas is treated with a process selected from the group consisting of chemical etching, plasma etching, laser normalization, vapor blasting, sanding, shot blasting and sand blasting prior to plating the resistive material thereon.

36. A method according to claim 33, wherein at least a portion of the resistive material is trimmed from the insulative substrate such that the resistor has an insulation resistance equal to a predetermined amount of ohms.

37. A method according to claim 34, wherein the resistive material is selected from the group consisting of electroless nickel-phosphorous with a phosphorous content in the plated resistive material of at least 10% by weight and electroless palladium-phosphorous with a phosphorous content in the plated resistive material of at least 2% by weight.

38. A method according to claim 36, wherein the resistive material is trimmed by contacting at least portions of the resistive material with laser light such that at least portions of the resistive material are ablated or otherwise removed by such contact.

39. A method according to claim 38, wherein the resistive material is selected from the group consisting of electroless nickel-phosphorous with a phosphorous content in the plated resistive material of at least 10% by weight and electroless palladium-phosphorous with a phosphorous content in the plated resistive material of at least 2% by weight.

* * * * *